US012035485B2

(12) United States Patent
Lim et al.

(10) Patent No.: US 12,035,485 B2
(45) Date of Patent: Jul. 9, 2024

(54) PRINTED CIRCUIT BOARD AND METHOD FOR MANUFACTURING THE SAME

(71) Applicant: SAMSUNG ELECTRO-MECHANICS CO., LTD., Suwon-si (KR)

(72) Inventors: Guh Hwan Lim, Suwon-si (KR); Chi Seong Kim, Suwon-si (KR); Won Seok Lee, Suwon-si (KR); Jin Oh Park, Suwon-si (KR); Yu Mi Kim, Suwon-si (KR); Sang Yun Lee, Suwon-si (KR); Eun Sun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 7 days.

(21) Appl. No.: 17/726,896

(22) Filed: Apr. 22, 2022

(65) Prior Publication Data
US 2023/0199976 A1    Jun. 22, 2023

(30) Foreign Application Priority Data
Dec. 20, 2021    (KR) .......................... 10-2021-0182612

(51) Int. Cl.
| H05K 1/11 | (2006.01) |
| H05K 1/18 | (2006.01) |
| H05K 3/40 | (2006.01) |
| H05K 3/46 | (2006.01) |

(52) U.S. Cl.
CPC .......... *H05K 3/4697* (2013.01); *H05K 1/115* (2013.01); *H05K 3/4038* (2013.01); *H05K 3/4644* (2013.01); *H05K 2201/09036* (2013.01)

(58) Field of Classification Search
CPC ........ H05K 1/182; H05K 1/183; H05K 1/185; H05K 1/186; H05K 1/115; H05K 1/0203; H05K 1/0271; H05K 2201/09036
See application file for complete search history.

(56) References Cited

U.S. PATENT DOCUMENTS

| 9,215,805 B2 * | 12/2015 | Zanma | H05K 1/185 |
| 2012/0186861 A1 * | 7/2012 | Shimizu | H05K 1/185 |
| | | | 174/258 |
| 2014/0030471 A1 * | 1/2014 | Otsubo | H05K 1/186 |
| | | | 428/68 |
| 2014/0347834 A1 * | 11/2014 | Lee | H05K 1/185 |
| | | | 361/761 |
| 2015/0257274 A1 * | 9/2015 | Kusama | H05K 1/185 |
| | | | 29/841 |

(Continued)

FOREIGN PATENT DOCUMENTS

| JP | H09-307020 A | 11/1997 |
| JP | 2016-167491 A | 9/2016 |
| JP | 6641717 B2 | 2/2020 |

*Primary Examiner* — Roshn K Varghese
(74) *Attorney, Agent, or Firm* — MORGAN, LEWIS & BOCKIUS LLP

(57) ABSTRACT

A printed circuit board includes a first insulating layer having a through cavity and containing an insulating material. A length between one side surface and the other side surface opposite to the one side surface of the through cavity is greater than a thickness of the first insulating layer, and the first insulating layer includes a recess located in each of an upper edge and a lower edge of the one side surface of the through cavity.

18 Claims, 15 Drawing Sheets

(56) References Cited

U.S. PATENT DOCUMENTS

2017/0178992 A1* 6/2017 Jeong .................. H01L 24/20
2018/0084651 A1   3/2018 Yoshida
2019/0013300 A1* 1/2019 Baek ................... H01L 23/552

* cited by examiner

PRINTED CIRCUIT BOARD AND METHOD FOR MANUFACTURING THE SAME

CROSS-REFERENCE TO RELATED APPLICATION(S)

This application claims benefit of priority to Korean Patent Application No. 10-2021-0182612 filed on Dec. 20, 2021 in the Korean Intellectual Property Office, the disclosure of which is incorporated herein by reference in its entirety.

TECHNICAL FIELD

The present disclosure relates to a printed circuit board and a method for manufacturing a printed circuit board.

BACKGROUND

In accordance with the implementation of high performance and/or super-integration in an electrical device to which a printed circuit board is applicable, a component having a large size in a wide range of types may be coupled to the printed circuit board, and there may be a demand for reducing likelihood of warpage of the printed circuit board as well as a size of the printed circuit board.

SUMMARY

An aspect of the present disclosure may provide a printed circuit board and a method for manufacturing a printed circuit board.

According to an aspect of the present disclosure, a printed circuit board may include a first insulating layer having a through cavity and containing an insulating material. A length between one side surface and the other side surface opposite to the one side surface of the through cavity may be greater than a thickness of the first insulating layer, and the first insulating layer may include a recess located in each of an upper edge and a lower edge of the one side surface of the through cavity.

According to another aspect of the present disclosure, a printed circuit board may include: a first insulating layer having a first through cavity and containing an insulating material; and a first component disposed in the first through cavity. The first insulating layer may include a recess located in each of an upper edge and a lower edge of one side surface of the first through cavity.

According to another aspect of the present disclosure, a method for manufacturing a printed circuit board may include: forming a hole by irradiating a laser to a portion of a first insulating layer; and forming a through cavity by colliding a plurality of particles with a region including the hole of the first insulating layer.

According to another aspect of the present disclosure, a printed circuit board may include a first insulating layer having a through cavity and a via hole; first and second conductive layers respectively disposed on upper and lower surfaces of the first insulating layer; and a via disposed in the through hole to connect the first and second conductive layers to each other. Among a side surface of the through hole and a side surface of the through cavity, only the side surface of the through cavity may be provided with a recess located in each of an upper edge and a lower edge of the side surface.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
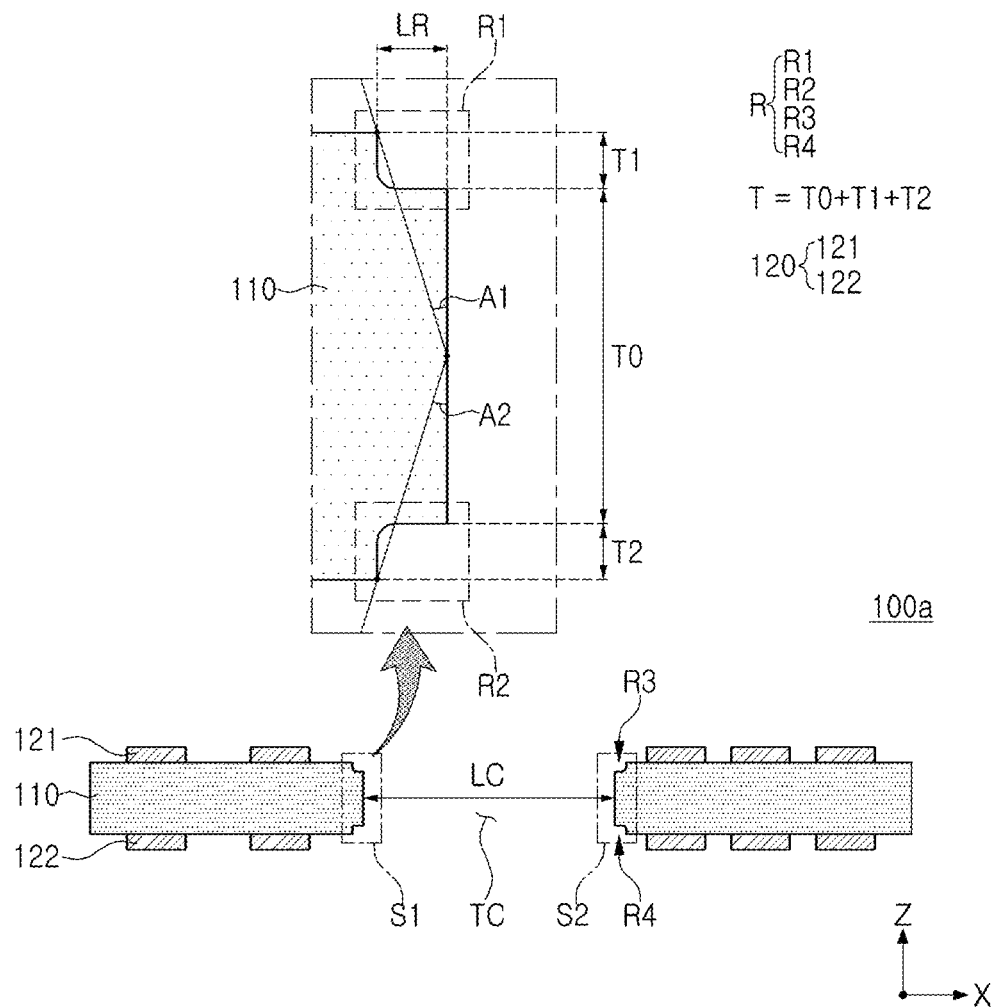
FIG. 1 is a side view illustrating a printed circuit board according to an exemplary embodiment of the present disclosure.

FIG. 1 is a side view illustrating a printed circuit board according to an exemplary embodiment of the present disclosure.

Referring to FIG. 1, a printed circuit board 100a according to an exemplary embodiment of the present disclosure may include a first insulating layer 110 having a through cavity TC and containing an insulating material. For example, at least one of an upper surface and a lower surface of the first insulating layer 110 may be a surface on which a conductive layer 120 is disposed, and the conductive layer 120 may include first and second conductive layers 121 and 122.

A length LC between one side surface S1 and the other side surface S2 opposite to the one side surface S1 of the through cavity TC may be greater than a thickness T of the first insulating layer 110. Accordingly, the through cavity TC may provide a space for placing a component.

As the through cavity TC has a larger length LC, the through cavity TC may accommodate a component in a larger size or in more various types. A ratio of the length LC of the through cavity TC to an entire length of the first insulating layer 110 in an X direction may be set not to exceed a reference ratio in consideration of durability, heat releasing efficiency, or stacking stability with respect to adjacent components of the first insulating layer 110, or likelihood of warpage of the printed circuit board 100a.

As the first insulating layer 110 has a larger thickness T, the durability, heat releasing efficiency, or stacking stability with respect to adjacent components of the first insulating layer 110 may be further improved, or the likelihood of warpage of the printed circuit board 100a may be reduced. Therefore, the reference ratio may be higher as the first insulating layer 110 has a larger thickness T.

In addition, as the through cavity TC accommodates a component in a larger size or in more various types, the printed circuit board 100a may include a larger number of layers stacked, or the printed circuit board 100a may need to have higher heat releasing performance. As the printed circuit board 100a includes a larger number of layers stacked, the likelihood of warpage of the printed circuit board 100a may be higher. As the first insulating layer 110 has a larger thickness T, the first insulating layer 110 may be stronger, thereby reducing the likelihood of warpage of the printed circuit board 100a depending on the total number of layers stacked.

Consequently, the through cavity TC having higher component accommodating performance (e.g., an allowable maximum size of a component to be accommodated, how many types of components are accommodatable, and heat releasing performance) is likely to have a larger length LC and a larger thickness T. As the through cavity TC has a larger length LC and the first insulating layer 110 has a larger thickness T, it may be more difficult to secure efficiency and/or reliability in forming the through cavity TC.

In this regard, the first insulating layer 110 may include recesses R located at an upper edge and a lower edge, respectively, of one side surface S1 of the through cavity TC. For example, the recesses R may increase durability against external factors, efficiency in releasing heat from a component to be disposed in the through cavity TC, or structural stability with respect to the through cavity TC of the first insulating layer 110. Therefore, the recesses R make it possible to increase a range for a volume of the through cavity TC that the first insulating layer 110 substantially allows, so that the printed circuit board 100a has a through cavity TC with high component accommodating performance, while improving efficiency and/or reliability in forming the through cavity TC.

For example, the recesses R may be traces of a two-step process for forming the through cavity TC, and the two-step process for forming the through cavity TC may improve efficiency and/or reliability in forming the through cavity TC. For example, when a laser is irradiated to a portion of the first insulating layer 110 as a first step for forming a through cavity TC, the through cavity TC may be formed to have a large length LC in a relatively efficient manner. Here, as the through cavity TC has a larger thickness, a deformation product (e.g., at least one of a scorch mark, a residue, and a deformation of an insulating material) of the first insulating layer 110 caused by laser energy on one side surface S1 and the other side surface S2 of the through cavity TC may have a more influence on the reliability of the through cavity TC. At this point, while a second step for increasing the length LC of the through cavity TC is performed, the deformation product of the first insulating layer 110 may also be removed. At this time, the recesses R may be formed.

For example, the recesses R may include a first recess R1 located at an upper edge of one side surface S1 of the through cavity TC, a second recess R2 located at a lower edge of one side surface S1 of the through cavity TC, a third recess R3 located at an upper edge of the other side surface S2 of the through cavity TC, and a fourth recess R4 located at a lower edge of the other side surface S2 of the through cavity TC.

For example, a thickness T0 of a portion between the upper edge and the lower edge of one side surface S1 where the recess R is not applied may be larger than a half of the thickness T of the first insulating layer 110. The sum of the thickness T0, a thickness T1 of the first recess R1, and a thickness T2 of the second recess R2 may be the thickness T of the first insulating layer 110, and thus, the sum of the thickness T1 and the thickness T2 may be smaller than the thickness T0. As a result, the durability against external factors, efficiency in releasing heat from a component to be disposed in the through cavity TC, or structural stability with respect to the through cavity TC of the first insulating layer 110 may be further improved. For example, a relationship between the thickness T and the thicknesses T1 and T2 may be established by a manufacturing method illustrated in FIGS. 2A and 2B, but is not limited thereto.

For example, an angle A1 formed by a straight line between an upper edge of the first insulating layer 110 to which the recess R is applied and the center of one side surface S1 of the through cavity TC and a vertical direction may be different from an angle A2 formed by a straight line between a lower edge of the first insulating layer 110 to which the recess R is applied and the center of one side surface S1 of the through cavity TC and the vertical direction. The difference between the angles A1 and A2 may be caused due to a difference in direction in which a plurality of particles illustrated in FIG. 2B collide with the first insulating layer, but is not limited thereto.

For example, at least a portion of the recess R may have a step shape such that the straight line between the upper edge of the first insulating layer 110 to which the recess R is applied and the center of one side surface S1 of the through cavity TC meets a portion of the first insulating layer 110. The step may be located at a point between the recess R and the portion where the recesses R are not located between the upper edge and the lower edge of one side surface S1 of the through cavity TC.

For example, at least a portion of the recess R may have a step shape such that the straight line between the upper edge of the first insulating layer 110 to which the recess R is applied and the center of one side surface S1 of the through cavity TC does not meet a point recessed deepest by the recess R on the first insulating layer 110. The step may be located at a point where the recess R has a largest depth (about 1.414 times larger than LR if the step is perfect and the recess is in a cubical form) from the center of the recess R in a direction toward the first insulating layer 110 (e.g., a diagonal direction between a −X direction and a −Z direction).

Figure 2A:
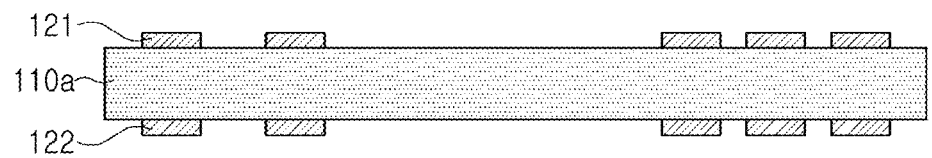
FIGS. 2A and 2B are views illustrating a method for manufacturing a printed circuit board according to an exemplary embodiment of the present disclosure.
Figure 2A:
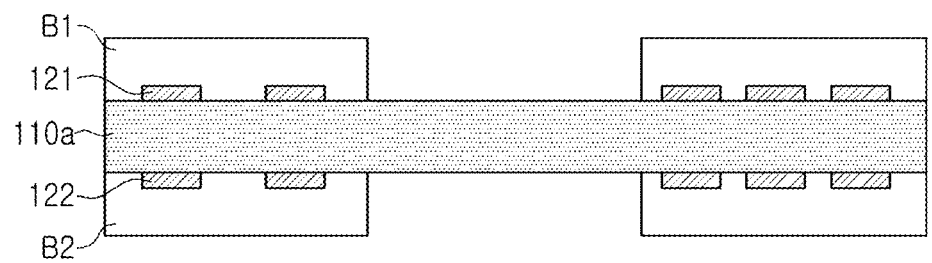
Figure 2A:
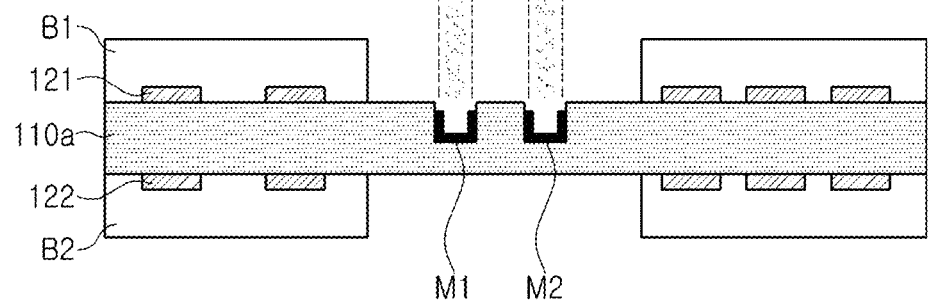
Figure 2B:
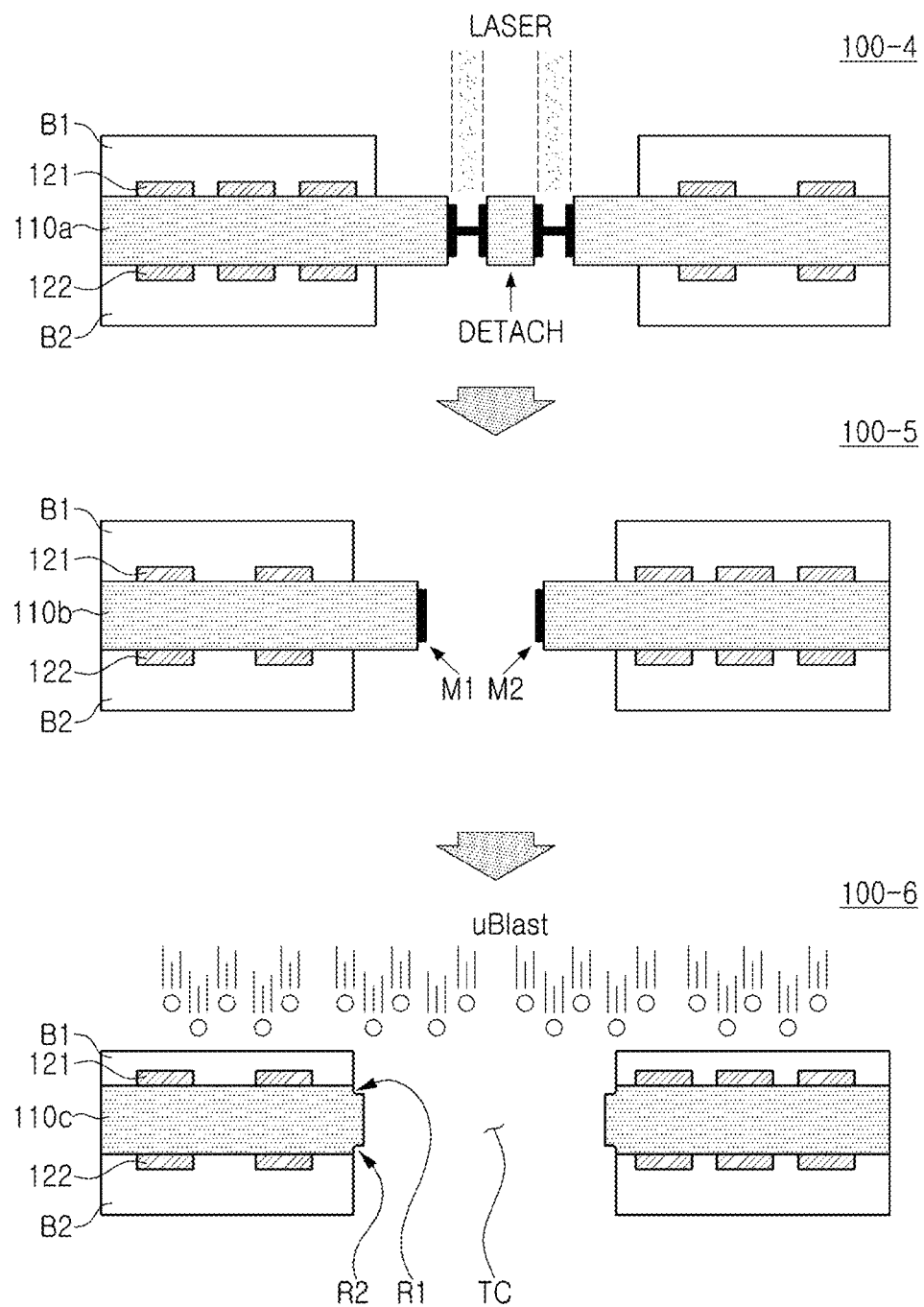

FIGS. 2A and 2B are views illustrating a method for manufacturing a printed circuit board according to an exemplary embodiment of the present disclosure.

Referring to FIGS. 2A and 2B, the printed circuit board according to an exemplary embodiment of the present disclosure illustrated in FIG. 1 may be manufactured by sequentially performing first to sixth steps 100-1 to 100-6. At least one of the first to sixth steps 100-1 to 100-6 may be omitted or modified, and thus, the printed circuit board illustrated in FIG. 1 is not limited as being manufactured by the method illustrated in FIGS. 2A and 2B.

Referring to FIG. 2A, the printed circuit board in the first step 100-1 may include a first insulating layer 110a with no through cavity. For example, the first insulating layer 110a may be formed by removing at least a portion of a copper foil from a copper clad laminate (CCL). First and second conductive layers 121 and 122 may be disposed on an upper surface and a lower surface of the first insulating layer 110a, respectively, but are not limited thereto. For example, the first and second conductive layers 121 and 122 may be formed according to a photolithography method.

Referring to FIG. 2A, the second step 100-2 may be a step for forming a protective layer B1 or B2 on at least one of the upper surface and the lower surface of the first insulating layer 110a before irradiating a laser. For example, the protective layers B1 and B2 may be photosensitive films, and may be affected by a process of forming a through cavity instead of portions protected by the protective layers B1 and B2 of the first insulating layer 110a.

Referring to FIGS. 2A and 2B, the third, fourth, and fifth steps 100-3, 100-4, and 100-5 may be steps for forming a hole by irradiating a laser to a portion of the first insulating layer 110a. The laser may be irradiated along an edge of the portion of the first insulating layer 110a, and the portion surrounded by the edge may be detached. A portion of the first insulating layer 110a may include a deformation product (e.g., at least one of a scorch mark, a residue, and a deformation of an insulating material) caused by laser energy, and deformed portions M1 and M2 may include the deformation product. In this way, a first insulating layer 110b having a hole may be implemented.

Referring to FIG. 2B, the sixth step 100-6 may be a step for forming a through cavity TC by colliding a plurality of particles (uBlast) onto a region including the hole of the first insulating layer 110b. Accordingly, a length between one side surface and the other side surface of the through cavity TC may be larger than that of the hole, the deformed portions M1 and M2 on one side surface and the other side surface of the through cavity TC may be removed, and first and second recesses R1 and R2 may be formed.

As a result, the through cavity TC substantially including no deformed portions M1 and M2 may be implemented without requiring a separate process for removing deformed portions M1 and M2 (e.g., high-pressure water washing, horizontal desmear, aden treatment, or the like), and the length between one side surface and the other side surface of the through cavity TC may increase efficiently (e.g., reducing a required time). In addition, contamination of the printed circuit board resulting from the deformed portions M1 and M2 may be prevented efficiently.

After the through cavity TC is formed, the protective layers B1 and B2 may be removed. For example, in a case in which the protective layers B1 and B2 are photosensitive films, the protective layers B1 and B2 may be removed using light or heat.

Figure 3A:
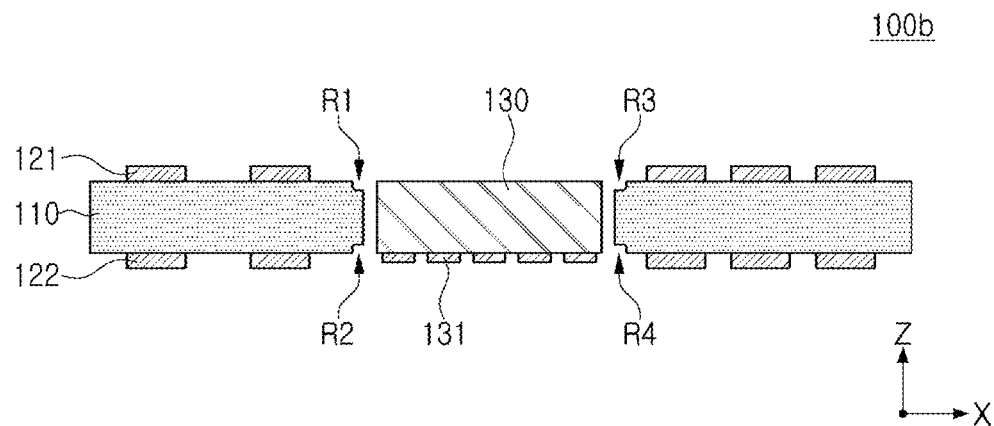
FIGS. 3A through 3C are side views illustrating structures that may be added to a printed circuit board according to an exemplary embodiment of the present disclosure.
Figure 3B:
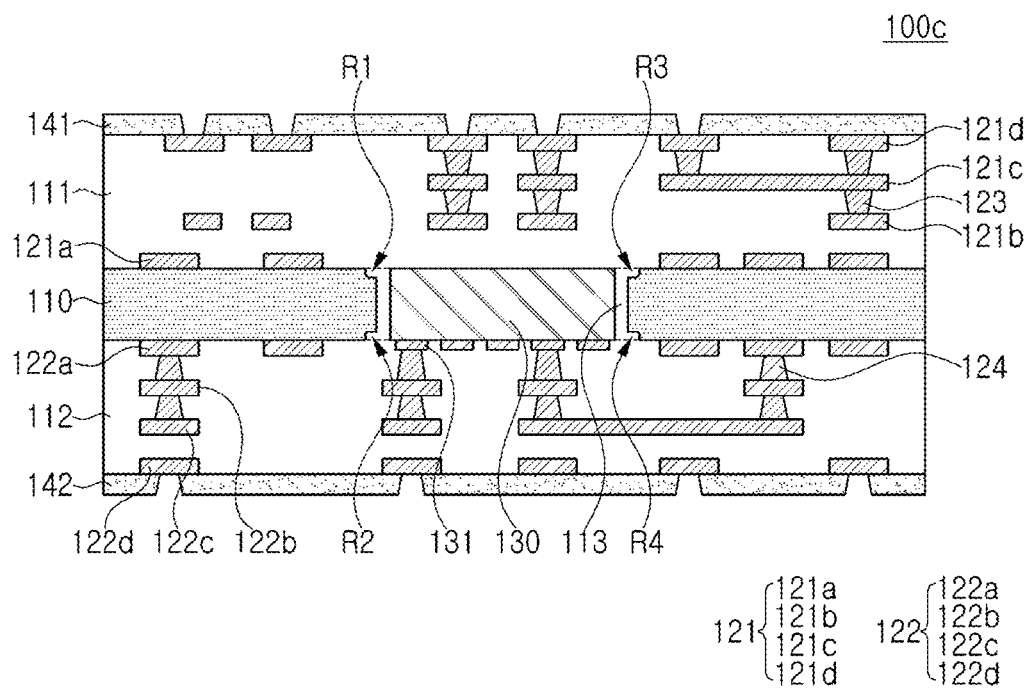
Figure 3C:
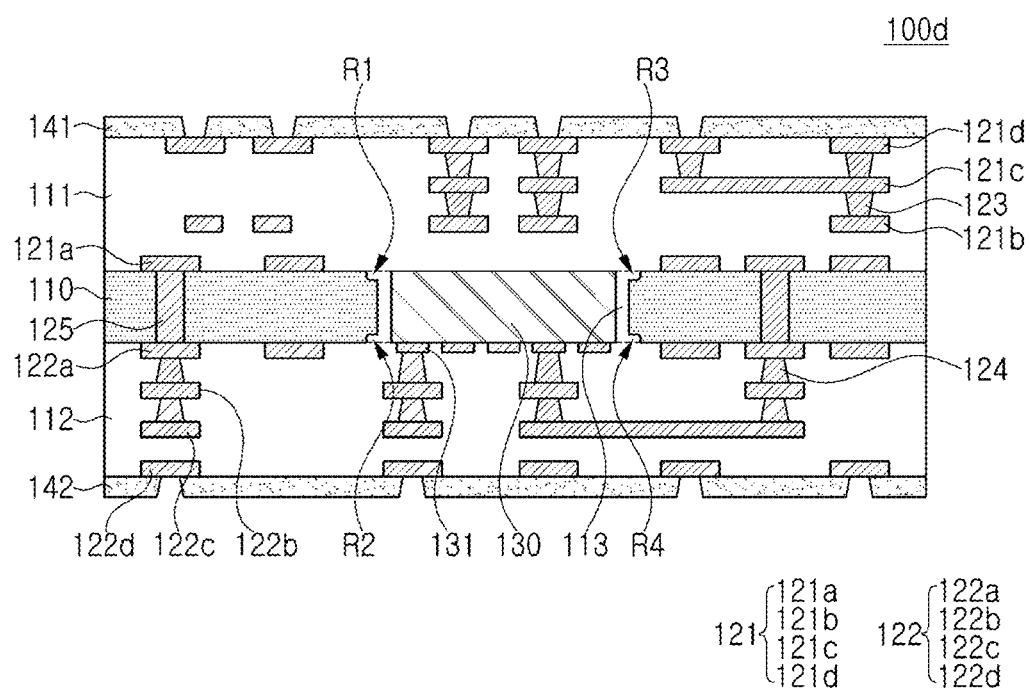

FIGS. 3A through 3C are side views illustrating structures that may be added to a printed circuit board according to an exemplary embodiment of the present disclosure.

Referring to FIG. 3A, a printed circuit board 100b according to an exemplary embodiment of the present disclosure may further include a component 130 disposed in a through cavity. For example, the component 130 may be an integrated circuit (IC) or a passive component (e.g., a capacitor, a coil, a resistor, or a resonator), and may include a connector 131 electrically connecting the inside and the outside of the component 130. The connector 131 may be a pin or a pad of the IC, or may be an electrode of the passive component.

Referring to FIGS. 3B and 3C, each of printed circuit boards 100c and 100d according to an exemplary embodiment of the present disclosure may further include at least one of second insulating layers 111 to 113, first conductive layers 121a to 121d, second conductive layers 122a to 122d, interlayer vias 123 and 124, and skin layers 141 and 142.

At least a portion of the second insulating layer 113 may be disposed in the through cavity, and may be disposed between the component 130 and the first insulating layer 110. At least a portion of the second insulating layer 111 or 112 may be disposed on at least one of an upper surface and a lower surface of the first insulating layer 110, and have a lower solidity than the first insulating layer 110. For example, the second insulating layer 111 or 112 may have a lower Young's modulus than that of the first insulating layer 110. For example, the second insulating layer 111 or 112 may have a lower rigidity or hardness than that of the first insulating layer 110.

For example, an insulating material that may be contained in the first insulating layer 110 and the second insulating layers 111 to 113 may be prepreg, Ajinomoto build-up film (ABF), FR-4, bismaleimide triazine (BT), photoimagable dielectric (PID) resin, or general copper clad laminate (CCL), and may be at least one selected from the group consisting of thermosetting resin such as epoxy resin, thermoplastic resin such as polyimide, polytetrafluoroethylene (PTFE), glass-based resin, and ceramic-based resin (e.g., a low temperature co-fired ceramic (LTCC)).

For example, the difference in solidity between the first and second insulating layers 110 and 111 to 113 may be realized by a difference in composition of an inorganic filler added to the insulating material. Depending on design, the first and second insulating layers 110 and 111 to 113 may be implemented with the same insulating material, and the printed circuit board may have a coreless structure.

For example, the number of first conductive layers 121a to 121d and the number of second insulating layers 111 may be two or more, and the first conductive layers 121a to 121d and the second insulating layers 111 may be alternately stacked. For example, the number of second conductive layers 122a to 122d and the number of second insulating layers 112 may be two or more, and the second conductive layers 122a to 122d and the second insulating layers 112 may be alternately stacked.

For example, the first conductive layers 121a to 121d and the second conductive layers 122a to 122d may contain a conductive material (e.g., copper (Cu), silver (Ag), palladium (Pd), aluminum (Al), nickel (Ni), titanium (Ti), gold (Au), or platinum (Pt)), and may be implemented by a semi-additive process (SAP), a modified semi-additive process (MSAP), a subtractive method, or the like.

The interlayer vias 123 may be vertically connected to upper surfaces and/or lower surfaces of the first conductive layers 121a to 121d, and the interlayer vias 124 may be vertically connected to upper surfaces and/or lower surfaces of the second conductive layers 122a to 122d. For example, the interlayer vias 123 and 124 may be formed by filling holes, which are formed using a laser or drill, with a conductive material (e.g., copper (Cu), silver (Ag), palladium (Pd), aluminum (Al), nickel (Ni), titanium (Ti), gold (Au), or platinum (Pt)).

For example, the skin layers 141 and 142 may be solder resist layers, and may contain an insulating material that is more photosensitive than that of the first and second insulating layers 110 and 111 to 113. Here, what is more photosensitive may be defined as what has a degree of curing more greatly varying depending on a unit time period of exposure to light and/or heat. Depending on design, an encapsulant may be applied onto outer surfaces of the skin layers 141 and 142, and thus, the skin layers 141 and 142 are not limitingly construed as being exposed to air.

Referring to FIG. 3C, the first insulating layer 110 may include a via 125, which may be a core via, penetrating through the first insulating layer 110, and the via 125 may electrically connect a first conductive layer 121 and a second conductive layer 122 to each other. The via 125 may have a width smaller than a length between one side surface and the other side surface of the component 130. A via hole in the first insulating layer 110, in which the via 125 is disposed, may be formed by a method different from the method to form the through cavity TC. For example, not both the laser colliding and the particle colliding are used to form the via hole in the first insulating layer 110. In this case, among a side surface of the through hole in which the via 125 is disposed and the side surfaces S1 and S2 of the through cavity TC, only the side surfaces S1 and S2 of the through cavity TC may be provided with the recesses R1 to R4.

Figure 4A:
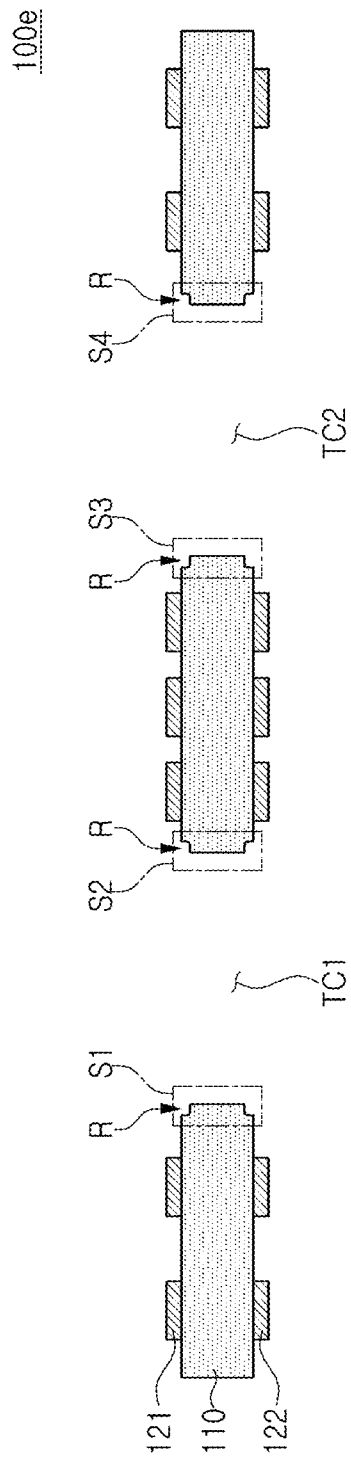
FIGS. 4A through 4C are side views illustrating first and second through cavities of a printed circuit board according to an exemplary embodiment of the present disclosure.
Figure 4B:
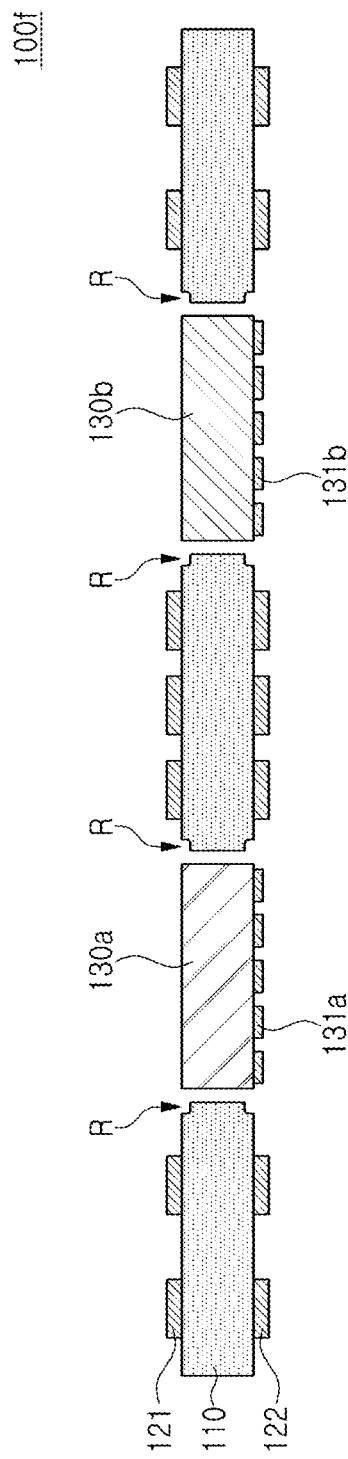
Figure 4C:
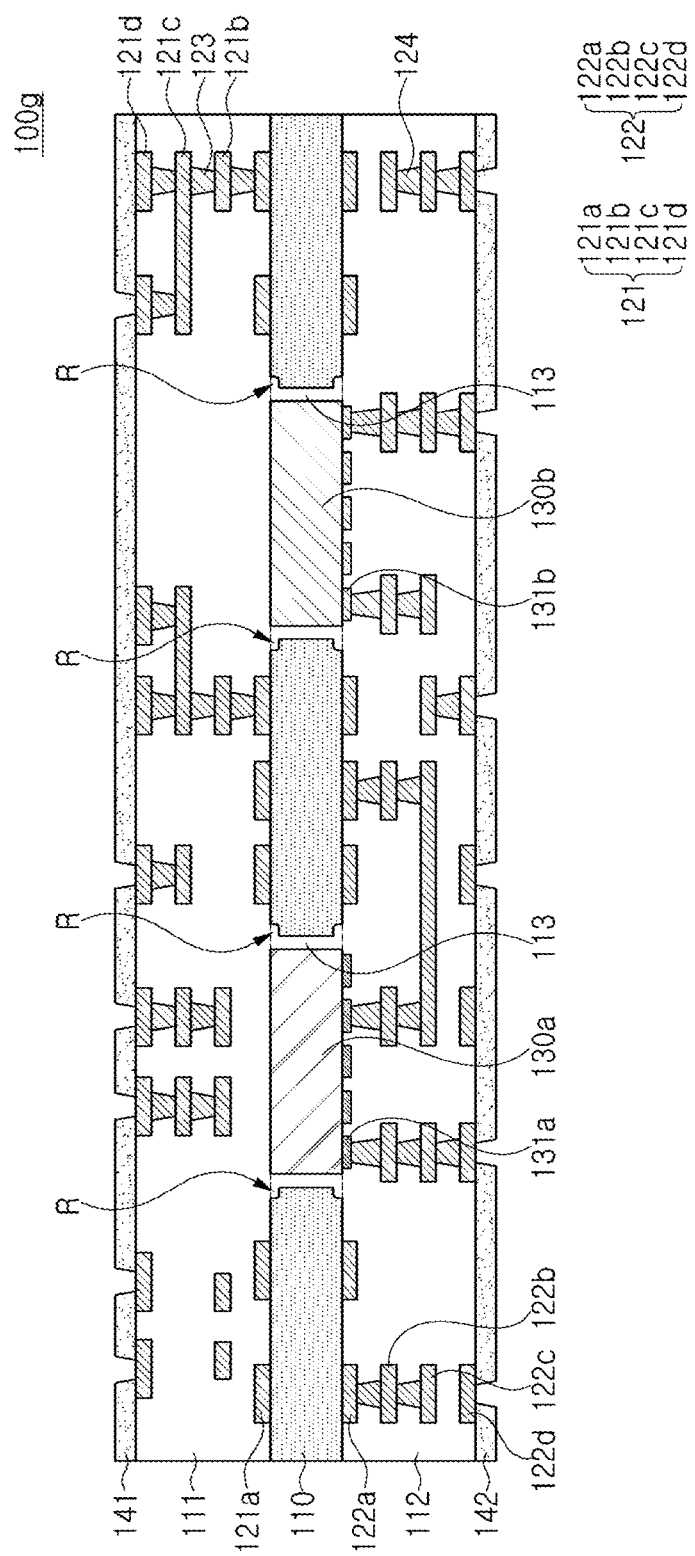

FIGS. 4A through 4C are side views illustrating first and second through cavities of a printed circuit board according to an exemplary embodiment of the present disclosure.

Referring to FIG. 4A, a printed circuit board 100e according to an exemplary embodiment of the present disclosure may include a first insulating layer 110 having a first through cavity TC1 and containing an insulating material. Recesses R may be located at upper edges and lower edges of one side surface S1 and the other side surface S2 of the first through cavity TC1.

The first insulating layer 110 may further include a second through cavity TC2. At least portions of recesses R may be located at upper edges and lower edges of one side surface S3 and the other side surface S4 opposite to the one side surface S3 of the second through cavity TC2. The first and second through cavities TC1 and TC2 may be identical to the through cavity TC illustrated in FIGS. 1 and 2B, but are not limited thereto.

Referring to FIG. 4B, a printed circuit board 100f according to an exemplary embodiment of the present disclosure may include a first component 130a disposed in a first through cavity TC1, and may further include a second component 130b disposed in a second through cavity TC2. The first component 130a may include a first connector 131a, and the second component 130b may include a second connector 131b.

For example, the first component 130a may be an IC, and the second component 130b may be a passive component. For example, the first component 130a may be a radio frequency (RF) IC, and the second component 130b may be a power management (PM) IC. For example, the first component 130a may be a multilayer ceramic capacitor, and the second component 130b may be a power inductor having a large power capacity.

For example, the recesses R may be located in the first insulating layer 110 such that an upper edge and a lower edge of the first insulating layer 110 are more recessed than an upper edge and a lower edge of one side surface of the first component 130a.

Referring to FIG. 4C, a printed circuit board 100g according to an exemplary embodiment of the present disclosure may further include at least one of second insulating layers 111 to 113, first conductive layers 121a to 121d, second conductive layers 122a to 122d, interlayer vias 123 and 124, and skin layers 141 and 142.

Figure 5A:
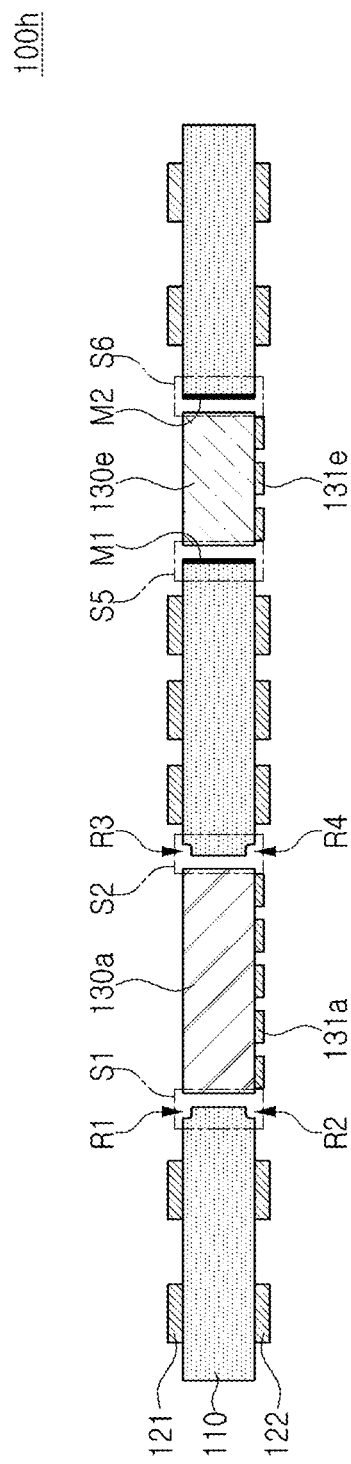
FIG. 5A is a side view illustrating first and second through cavities that are different in whether recesses are present or absent in a printed circuit board according to an exemplary embodiment of the present disclosure.

FIG. 5A is a side view illustrating first and second through cavities that are different in whether recesses are present or absent in a printed circuit board according to an exemplary embodiment of the present disclosure.

Referring to FIG. 5A, in a printed circuit board 100h according to an exemplary embodiment of the present disclosure, a length between the center of one side surface and the center of the other side surface opposite to the one side surface of a first component 130a may be different from a length between the center of one side surface and the center of the other side surface opposite to the one side surface of a second component 130e. For example, the first component 130a may be an IC, and the second component 130e may be a passive component. Recesses may include first to fourth recesses R1 to R4.

When the second component 130e is smaller than the first component 130a, one side surface S5 and the other side surface S6 opposite to the one side surface S5 of a second through cavity in which the second component 130e is disposed may not substantially include recesses. Thus, a thickness of a portion where the first and second recesses R1 and R2 are not located between an upper edge and a lower edge of one side surface S1 of a first through cavity may be different from a thickness of a portion where recesses are not located between an upper edge and a lower edge of one side surface S5 of the second through cavity.

For example, when the second through cavity in which the second component 130e is disposed has a smaller size than the first through cavity, deformed portions M1 and M2 that may be located on one side surface S5 and the other side surface S6 of the second through cavity may have a relatively smaller influence. Thus, the first insulating layer 110 may include deformed portions M1 and M2 each containing a deformation product of an insulating material in a larger amount on one side surface S5 of one of the first and second through cavities than on one side surface S1 of the other one of the first and second through cavities. In this case, due to the difference whether the recesses are provided, a difference between a length between centers of one side surface and the other side surface of the first through cavity and a length between edges of the one side surface and the other side surface of the first through cavity, may be greater than a difference between a length between centers of one side surface and the other side surface of the second through cavity and a length between edges of the one side surface and the other side surface of the second through cavity.

That is, the first insulating layer 110 is not limited to including no deformed portions M1 and M2 in its entirety, as long as the first insulating layer 110 includes a through cavity including first and second recesses R1 and R2.

Figure 5B:
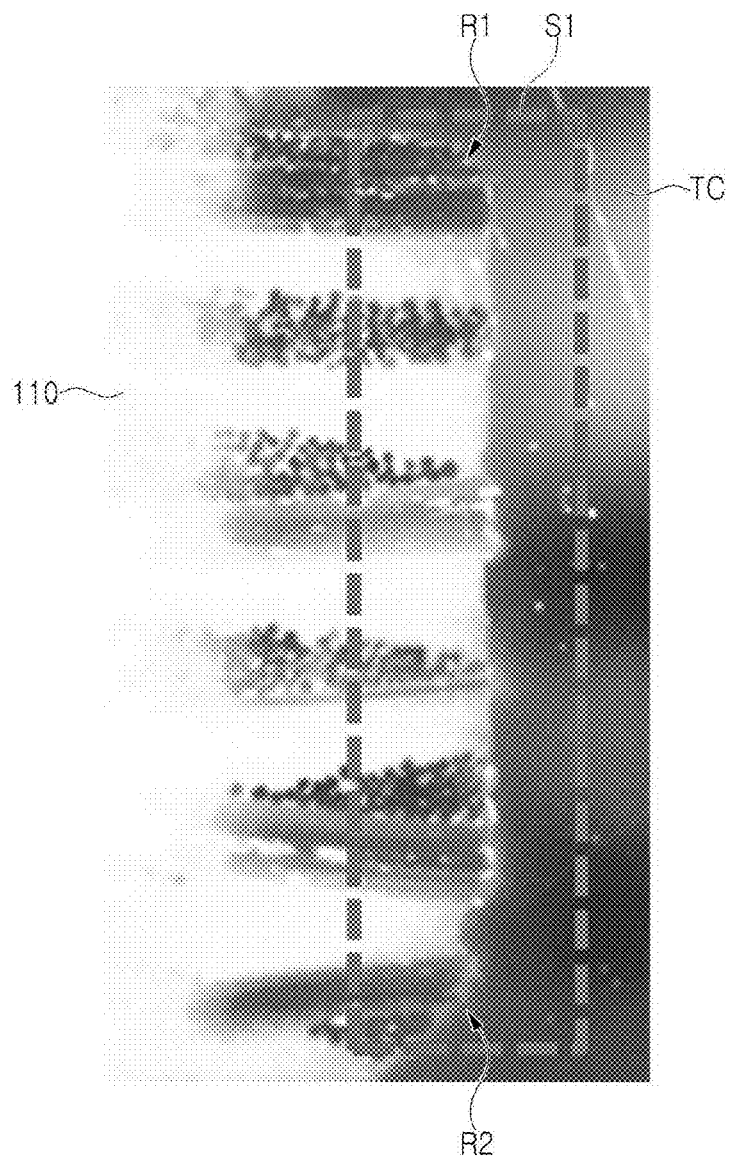
FIG. 5B is a photograph illustrating side surfaces of a through cavity of FIG. 1.
Figure 5C:
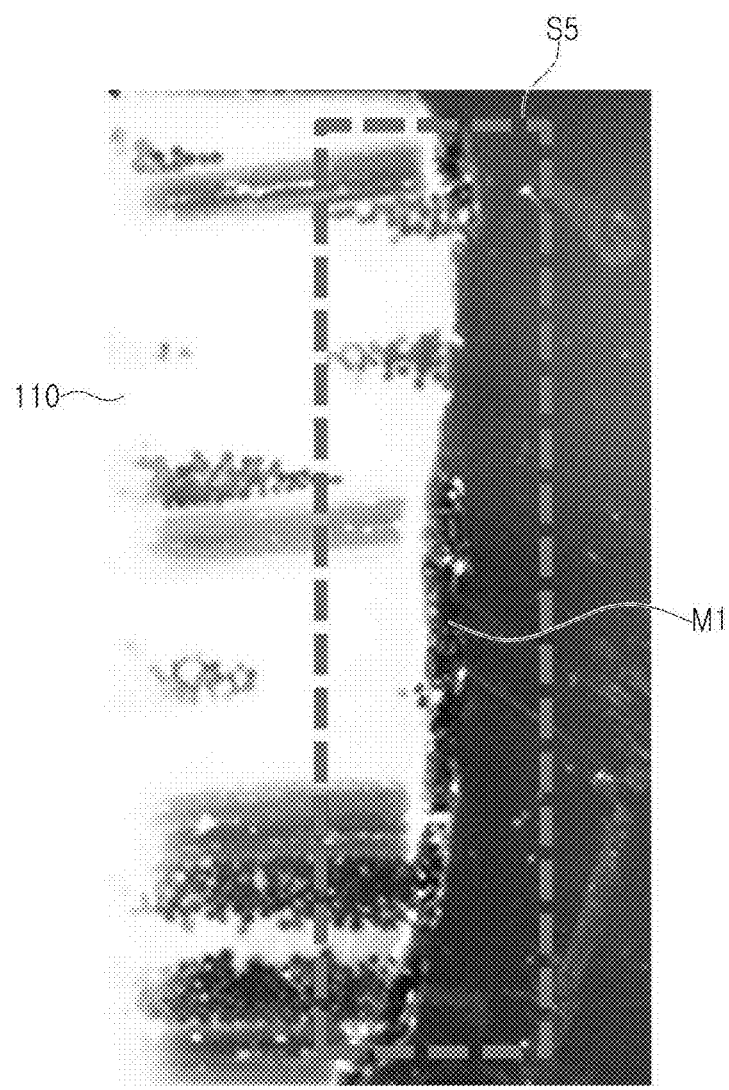
FIG. 5C is a photograph illustrating side surfaces of a second through cavity of FIG. 5A.
Figure 5D:
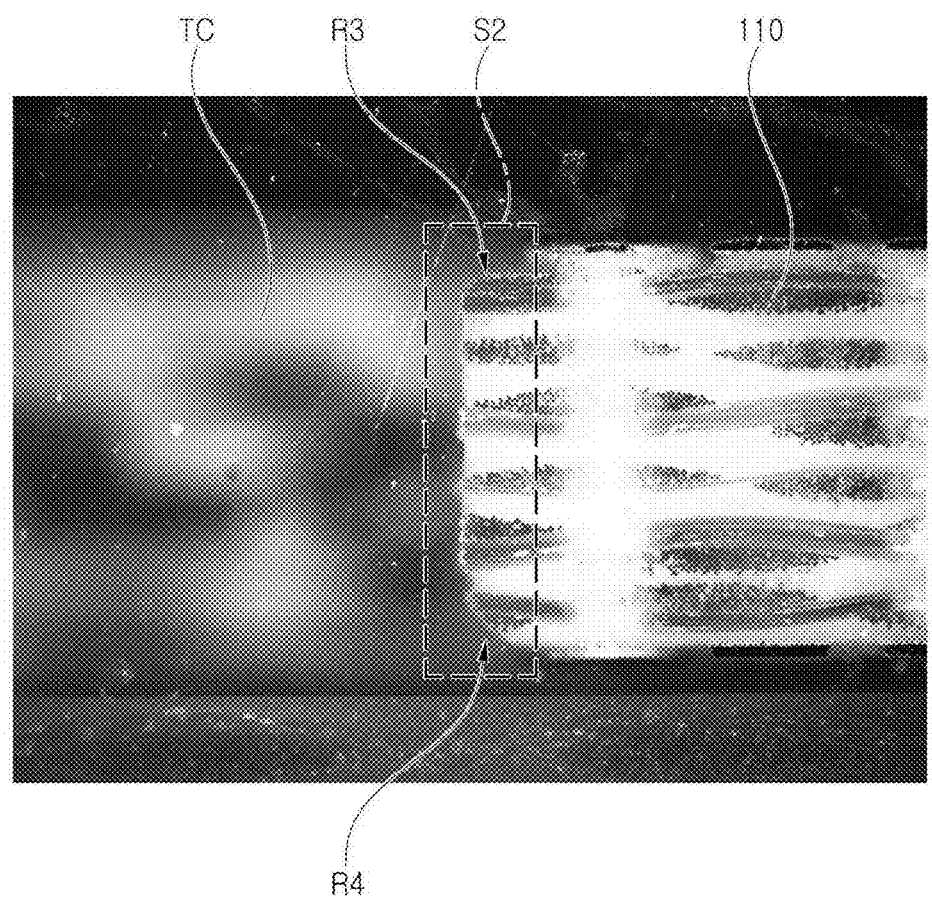
FIG. 5D is a photograph illustrating side surfaces of a through cavity of FIG. 1.

FIGS. 5B and 5D are photographs illustrating the side surfaces of the through cavity of FIG. 1, and FIG. 5C is a photograph illustrating the side surfaces of the second through cavity of FIG. 5A.

Referring to FIGS. 5B and 5D, the first insulating layer 110 may include first and second recesses R1 and R2 located at the upper edge and the lower edge of one side surface S1 of the through cavity TC, and third and fourth recesses R3 and R4 located at the upper edge and the lower edge of the other side surface S2 of the through cavity TC. One side surface S1 of the through cavity TC may not substantially include a deformed portion M1 of FIG. 5C.

Referring to FIG. 5C, one side surface S5 of the second through cavity of the first insulating layer 110 may include a deformed portion M1.

Figure 6A:
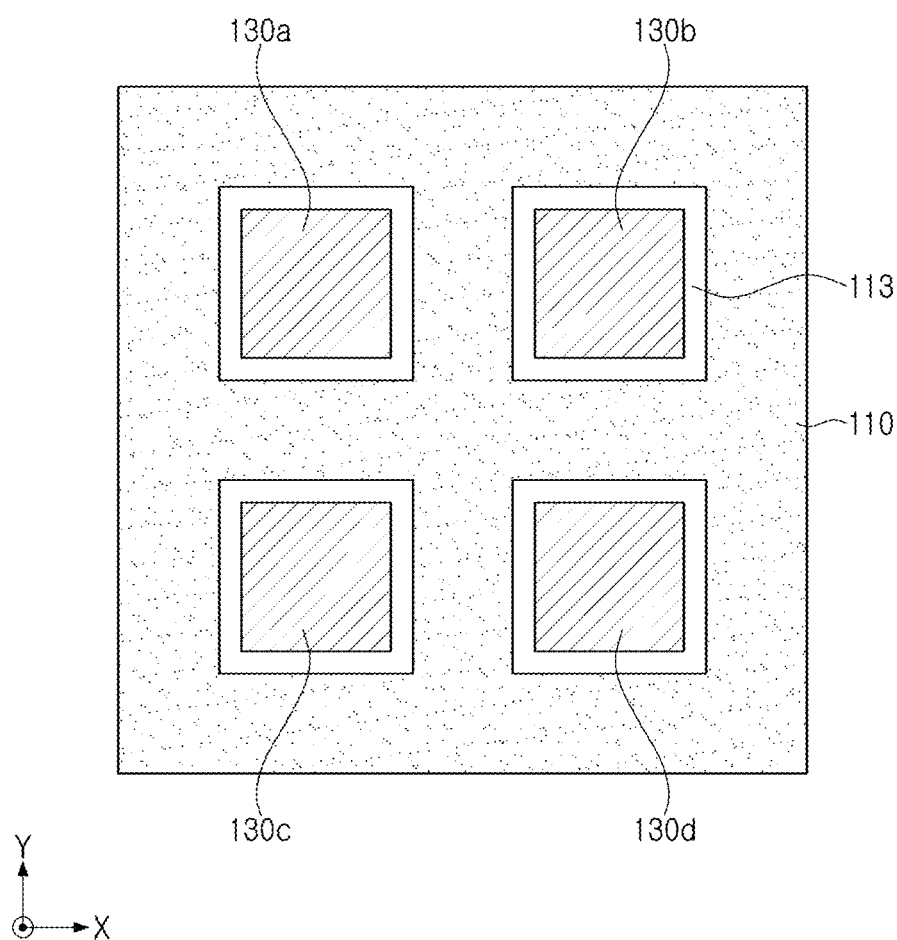
FIG. 6A is a plan view illustrating a printed circuit board according to an exemplary embodiment of the present disclosure.

FIG. 6A is a plan view illustrating a printed circuit board according to an exemplary embodiment of the present disclosure.

Referring to FIG. 6A, a first insulating layer 110 may include at least one of first to fourth components 130a to 130d.

Figure 6B:
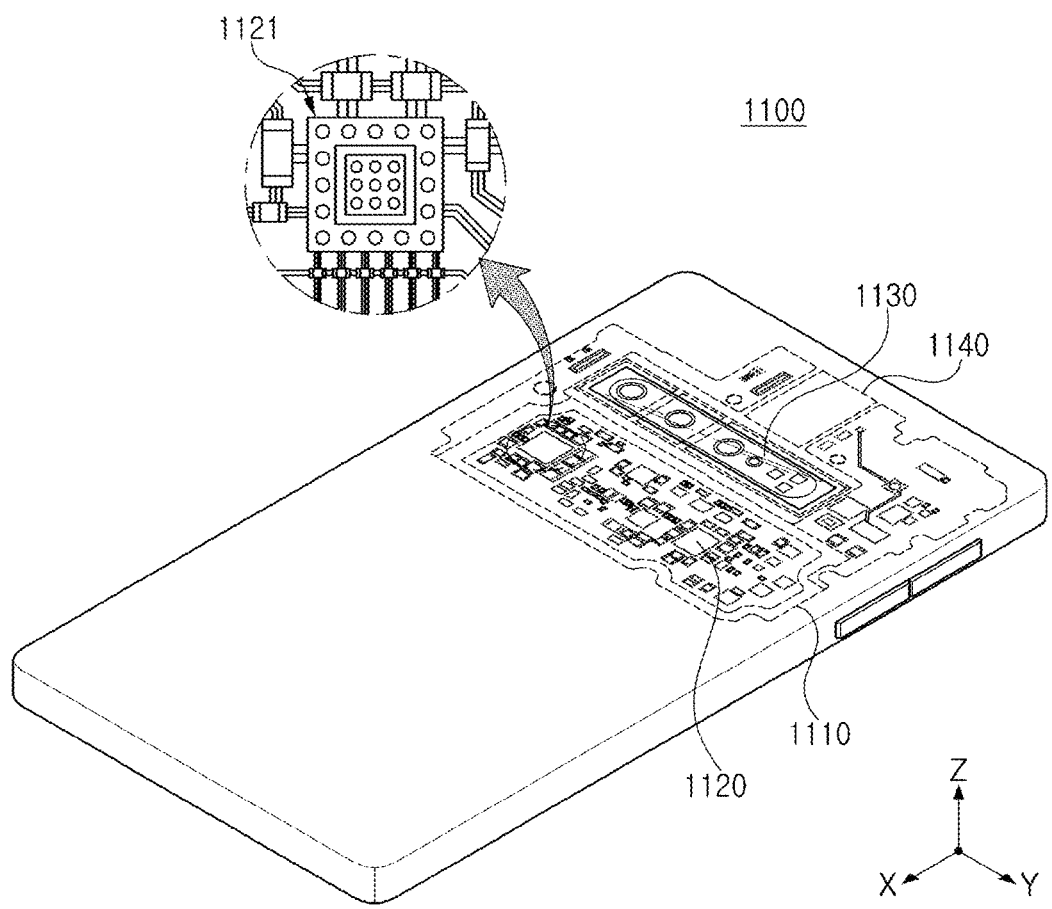
FIG. 6B is a view illustrating a structure of an electronic device in which a printed circuit board according to an exemplary embodiment of the present disclosure may be disposed.
Figure 6C:
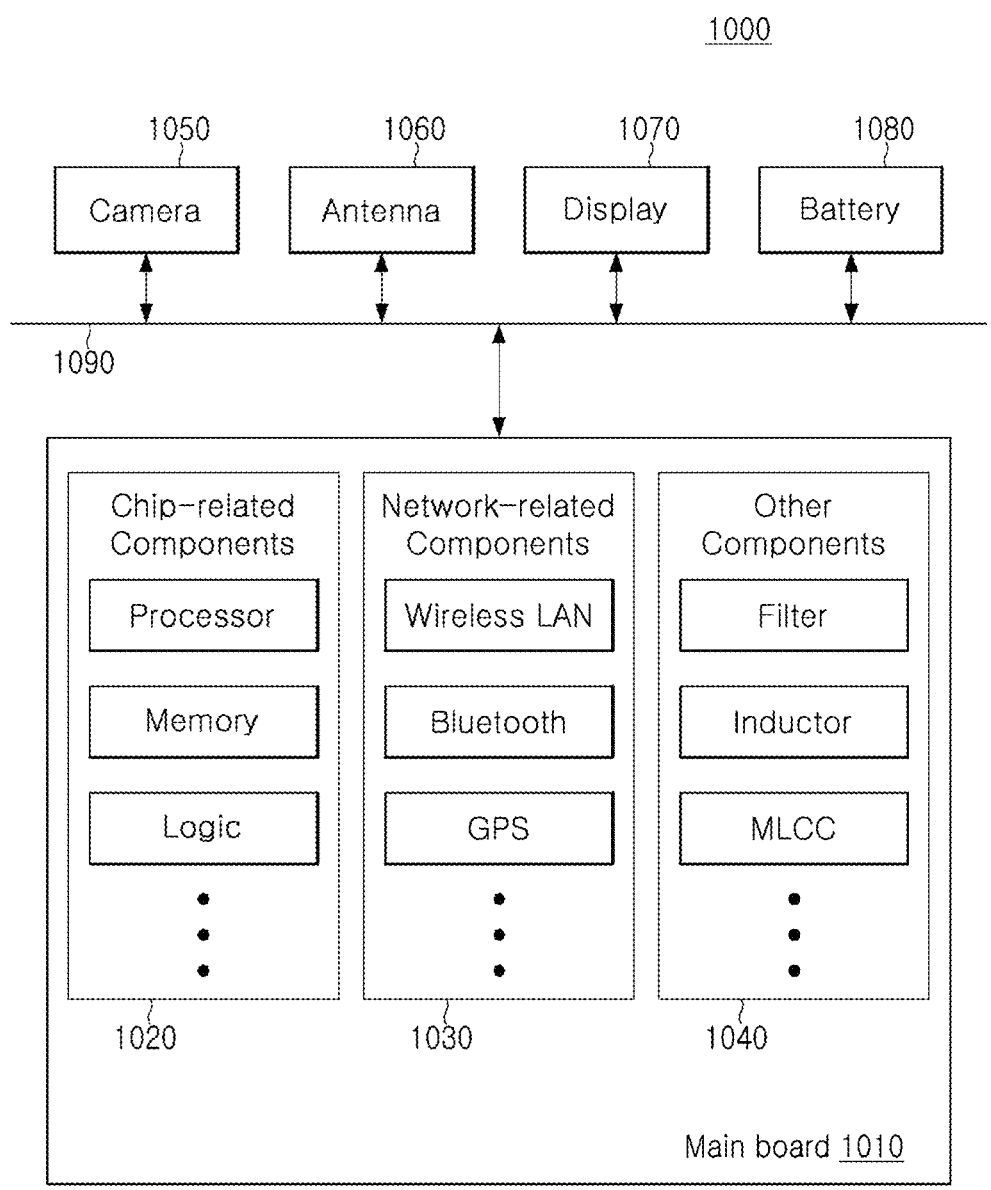
FIG. 6C is a view illustrating a system of an electronic device in which a printed circuit board according to an exemplary embodiment of the present disclosure may be disposed.

FIG. 6B is a view illustrating a structure of an electronic device in which a printed circuit board according to an exemplary embodiment of the present disclosure may be disposed, and FIG. 6C is a view illustrating a system of an electronic device in which a printed circuit board according to an exemplary embodiment of the present disclosure may be disposed.

Referring to FIGS. 6B and 6C, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, the chip-related components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related components 1020 and/or the network-related components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

The electronic device may be, for example, a smartphone 1100. A motherboard 1110 may be accommodated in the smartphone 1100, and various components 1120 may be physically and/or electrically connected to the motherboard 1110. Also, other components that may or may not be physically and/or electrically connected to the motherboard 1110, such as a camera module 1130 and/or a speaker 1140, may be accommodated in the smartphone 1100. Some of the components 1120 may be the above-described chip-related components, e.g., a component package 1121, but are not limited thereto. The component package 1121 may be in the form of a printed circuit board on which electronic components including active components and/or passive components are surface-mounted. Alternatively, the component package 1121 may be in the form of a printed circuit board in which active components and/or passive components are embedded. Meanwhile, the electronic device is not necessarily limited to the smartphone 1100, but may be any other electronic device as described above. The motherboard 1110 may be a printed circuit board according to an exemplary embodiment of the present disclosure, but the printed circuit board is not limited to the motherboard 1110.

As set forth above, the printed circuit board and the method for manufacturing the printed circuit board according to exemplary embodiments of the present disclosure are capable of increasing a range for an allowable size of a component to be embedded, expanding allowable types of components to be embedded, increasing efficiency in releasing heat from a component to be embedded, reducing likelihood of warpage caused by a component to be embedded, increasing efficiency and reliability in forming a structure for embedding a component, or reducing contamination resulting from the structure for embedding a component.

While exemplary embodiments have been shown and described above, it will be apparent to those skilled in the art that modifications and variations could be made without departing from the scope of the present disclosure as defined by the appended claims.

What is claimed is:
1. A printed circuit board comprising:
a first insulating layer composed of a single layer, and having a first through cavity and containing an insulating material,
wherein a length between one side surface and the other side surface opposite to the one side surface of the first through cavity is greater than a thickness of the first insulating layer,
wherein the first insulating layer includes a first recess located in each of an upper edge and a lower edge of the one side surface of the first through cavity, wherein a first component is disposed in the first through cavity,
wherein the first insulating layer further includes a second through cavity,
wherein a second component is disposed in the second through cavity,
wherein a second recess is further provided at each of an upper edge and a lower edge of one side surface of the second through cavity,
wherein a length between centers of one side surface and the other side surface of the first component is different from a length between centers of one side surface and the other side surface of the second component, and
wherein a thickness of a portion between the upper edge and the lower edge of the first through cavity where the first recess is not applied is different from a thickness of a portion between the upper edge and the lower edge of the second through cavity where the second recess is not applied.

2. The printed circuit board of claim 1, wherein a thickness of a portion between the upper edge and the lower edge where the first recess is not applied is larger than a half of the thickness of the first insulating layer.

3. The printed circuit board of claim 1, wherein an angle between a straight line between the upper edge and a center of the one side surface of the first through cavity and a vertical direction is different from an angle between a straight line between the lower edge and the center and the vertical direction.

4. The printed circuit board of claim 1, wherein at least a portion of the first recess has a step shape such that a straight line between an upper edge of the first insulating layer and a center of the one side surface of the first through cavity meets a portion of the first insulating layer.

5. The printed circuit board of claim 1, wherein at least a portion of the first recess has a step shape such that a straight line between an upper edge of the first insulating layer and a center of the one side surface of the first through cavity does not meet a point recessed deepest by the first recess on the first insulating layer.

6. The printed circuit board of claim 1, further comprising a second insulating layer of which at least a portion is disposed in the through cavity,
wherein another recess is further provided at each of an upper edge and a lower edge of the other side surface of the through cavity.

7. The printed circuit board of claim 1, further comprising:
a second insulating layer disposed on at least one of an upper surface or a lower surface of the first insulating layer and having a lower solidity than the first insulating layer; and
a conductive layer containing a conductive material and disposed between at least a portion of the second insulating layer and the first insulating layer.

8. A printed circuit board comprising:
a first insulating layer composed of a single layer, and having a first through cavity and containing an insulating material; and
a first component disposed in the first through cavity,
wherein the first insulating layer includes a first recess located in each of an upper edge and a lower edge of one side surface of the first through cavity,
wherein the first insulating layer further includes a second through cavity,
wherein a second component is disposed in the second through cavity,
wherein a second recess is further provided at each of an upper edge and a lower edge of one side surface of the second through cavity,
wherein a length between centers of one side surface and the other side surface of the first component is different from a length between centers of one side surface and the other side surface of the second component, and
wherein a thickness of a portion between the upper edge and the lower edge of the first through cavity where the first recess is not applied is different from a thickness of a portion between the upper edge and the lower edge of the second through cavity where the second recess is not applied.

9. The printed circuit board of claim 8, wherein the first recess is located in the first insulating layer such that the upper edge and the lower edge are more recessed than an upper edge and a lower edge of one side surface of the first component.

10. The printed circuit board of claim 8, further comprising a second insulating layer disposed on at least one of an upper surface or a lower surface of the first insulating layer and having a lower solidity than the first insulating layer,
wherein another recess is further provided at each of an upper edge and a lower edge of the other side surface opposite to the one side surface of the first through cavity.

11. The printed circuit board of claim 8, wherein
a difference between a length between centers of one side surface and the other side surface of the first through cavity and a length between edges of the one side surface and the other side surface of the first through cavity, is greater than a difference between a length between centers of one side surface and the other side surface of the second through cavity and a length between edges of the one side surface and the other side surface of the second through cavity.

12. The printed circuit board of claim 8,
wherein the first insulating layer includes a deformed portion containing a deformation product of the insulating material in a larger amount on one side surface of one of the first and second through cavities than on one side surface of the other one of the first and second through cavities.

13. A printed circuit board comprising:
a first insulating layer composed of a single layer, and having a first through cavity and a via hole;
first and second conductive layers respectively disposed on upper and lower surfaces of the first insulating layer; and
a via disposed in the via hole to connect the first and second conductive layers to each other,
wherein among a side surface of the via hole and a side surface of the first through cavity, only the side surface of the first through cavity is provided with a recess located in each of an upper edge and a lower edge of the side surface,
wherein a first component is disposed in the first through cavity,
wherein the first insulating layer further includes a second through cavity,
wherein a second component is disposed in the second through cavity,
wherein a second recess is further provided at each of an upper edge and a lower edge of one side surface of the second through cavity,
wherein a length between centers of one side surface and the other side surface of the first component is different from a length between centers of one side surface and the other side surface of the second component, and wherein a thickness of a portion between the upper edge and the lower edge of the first through cavity where the first recess is not applied is different from a thickness of a portion between the upper edge and the lower edge of the second through cavity where the second recess is not applied.

14. The printed circuit board of claim 13, wherein a thickness of a portion between the upper edge and the lower edge where the first recess is not applied is larger than a half of the thickness of the first insulating layer.

15. The printed circuit board of claim 13, further comprising:
a second insulating layer disposed on at least one of an upper surface or a lower surface of the first insulating layer and having a lower solidity than the first insulating layer.

16. A printed circuit board comprising:
a first insulating layer composed of a single layer, and having a first through cavity and containing an insulating material;
a first component disposed in the first through cavity; and
a second component disposed in a second through cavity,
wherein the first insulating layer includes a recess located in each of an upper edge and a lower edge of one side surface of the first through cavity,
wherein the first insulating layer further includes the second through cavity, and
wherein the first insulating layer includes a deformed portion containing a deformation product of the insulating material in a larger amount on one side surface of one of the first and second through cavities than on one side surface of the other one of the first and second through cavities.

17. The printed circuit board of claim 16, wherein the recess is located in the first insulating layer such that the upper edge and the lower edge are more recessed than an upper edge and a lower edge of one side surface of the first component.

18. The printed circuit board of claim 16, further comprising a second insulating layer disposed on at least one of an upper surface or a lower surface of the first insulating layer and having a lower solidity than the first insulating layer,
wherein another recess is further provided at each of an upper edge and a lower edge of the other side surface opposite to the one side surface of the first through cavity.

* * * * *